United States Patent
Komatsu et al.

(10) Patent No.: US 10,146,130 B2
(45) Date of Patent: Dec. 4, 2018

(54) COMPOSITION FOR BASE, AND DIRECTED SELF-ASSEMBLY LITHOGRAPHY METHOD

(71) Applicant: JSR CORPORATION, Tokyo (JP)

(72) Inventors: Hiroyuki Komatsu, Tokyo (JP); Takehiko Naruoka, Tokyo (JP); Shinya Minegishi, Tokyo (JP); Kaori Sakai, Tokyo (JP); Tomoki Nagai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 15/595,030

(22) Filed: May 15, 2017

(65) Prior Publication Data

US 2017/0248847 A1    Aug. 31, 2017

Related U.S. Application Data

(62) Division of application No. 14/691,043, filed on Apr. 20, 2015, now Pat. No. 9,690,192.

(30) Foreign Application Priority Data

Apr. 21, 2014    (JP) .................................. 2014-087752

(51) Int. Cl.
*C08F 2/38*    (2006.01)
*C08F 8/34*    (2006.01)
(Continued)

(52) U.S. Cl.
CPC ............. *G03F 7/038* (2013.01); *B05D 3/064* (2013.01); *C09D 125/14* (2013.01);
(Continued)

(58) Field of Classification Search
CPC .......... C08L 25/14; C08L 33/02; C08L 33/12; C08L 43/02; C08F 12/08; C08F 20/02; C08F 20/14; C08F 28/00; C08F 30/02
See application file for complete search history.

(56) References Cited

U.S. PATENT DOCUMENTS 4,785,053 A * 11/1988 Ito .......................... C08F 265/06
525/100
8,653,211 B2 * 2/2014 Kang ...................... B82Y 30/00
526/193
(Continued)

FOREIGN PATENT DOCUMENTS

| JP | 2002-519728 A | 7/2002 |
| JP | 2003-218383 A | 7/2003 |

(Continued)

OTHER PUBLICATIONS

Han et al., Macromolecules 2008, 41, 9090-9097.*

*Primary Examiner* — Vu A Nguyen
(74) *Attorney, Agent, or Firm* — Oblon, McClelland, Maier & Neustadt, L.L.P.

(57) ABSTRACT

A composition for a base of a directed self-assembling film includes a compound including an oxo acid group, and a solvent. The compound is preferably represented by formula (1). A represents an organic group having 10 or more carbon atoms and having a valency of n. B represents an oxo acid group. n is an integer of 1 to 200. In a case where n is 2 or greater, a plurality of Bs are identical or different.

$$A\!\!-\!\!(B)_n \quad (1)$$

10 Claims, 2 Drawing Sheets

(51) Int. Cl.

| | | |
|---|---|---|
| *C08F 8/40* | (2006.01) | |
| *C08K 5/053* | (2006.01) | |
| *C08K 5/101* | (2006.01) | |
| *C08K 5/07* | (2006.01) | |
| *G03F 7/038* | (2006.01) | |
| *G03F 7/00* | (2006.01) | |
| *H01L 21/3065* | (2006.01) | |
| *B05D 3/06* | (2006.01) | |
| *H01L 21/027* | (2006.01) | |
| *C09D 125/14* | (2006.01) | |
| *H01L 21/033* | (2006.01) | |
| *C09D 153/00* | (2006.01) | |
| *G03F 7/004* | (2006.01) | |
| *G03F 7/039* | (2006.01) | |
| *G03F 7/11* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |
| *H01L 21/311* | (2006.01) | |

(52) U.S. Cl.
CPC ......... *C09D 153/00* (2013.01); *G03F 7/0002* (2013.01); *G03F 7/0045* (2013.01); *G03F 7/0046* (2013.01); *G03F 7/0048* (2013.01); *G03F 7/039* (2013.01); *G03F 7/11* (2013.01); *G03F 7/16* (2013.01); *G03F 7/168* (2013.01); *G03F 7/2006* (2013.01); *G03F 7/322* (2013.01); *G03F 7/38* (2013.01); *H01L 21/027* (2013.01); *H01L 21/0271* (2013.01); *H01L 21/0332* (2013.01); *H01L 21/3065* (2013.01); *H01L 21/31138* (2013.01); *C08L 2201/56* (2013.01)

(56) References Cited

U.S. PATENT DOCUMENTS

| | | | |
|---|---|---|---|
| 2001/0024684 | A1 | 9/2001 | Steiner et al. |
| 2007/0092640 | A1 | 4/2007 | Bruner |
| 2009/0214823 | A1 | 8/2009 | Cheng et al. |
| 2012/0116007 | A1* | 5/2012 | Gopalan ............ C08F 293/005 524/529 |
| 2013/0078576 | A1 | 3/2013 | Wu |
| 2013/0284698 | A1 | 10/2013 | Ogihara |
| 2014/0127626 | A1 | 5/2014 | Senzaki |

FOREIGN PATENT DOCUMENTS

| | | |
|---|---|---|
| JP | 2008-036491 A | 2/2008 |
| JP | 2008-149447 A | 7/2008 |
| JP | 2010-058403 A | 3/2010 |
| JP | 2012-174984 A | 9/2012 |
| WO | WO 2012/046770 A1 | 4/2012 |

* cited by examiner

# COMPOSITION FOR BASE, AND DIRECTED SELF-ASSEMBLY LITHOGRAPHY METHOD

CROSS-REFERENCE TO RELATED APPLICATIONS

The present application is a divisional application of U.S. patent application Ser. No. 14/691,043 filed Apr. 20, 2015, which claims priority to Japanese Patent Application No. 2014-087752, filed Apr. 21, 2014. The contents of this application are incorporated herein by reference in their entirety.

BACKGROUND OF THE INVENTION

Field of the Invention

The present invention relates to a composition for a base, and a directed self-assembly lithography method.

Discussion of the Background

Miniaturization of structures of various types of electronic devices such as semiconductor devices and liquid crystal devices has been accompanied by demands for microfabrication of patterns in lithography processes. In these days, although fine patterns having a line width of about 90 nm can be formed using, for example, an ArF excimer laser, further finer pattern formation has been required.

To meet the demands described above, a directed self-assembly lithography process which utilizes a phase separation structure constructed through directed self-assembly, as generally referred to, that spontaneously forms an ordered pattern has been proposed. As such a directed self-assembly lithography process, a method for forming an ultrafine pattern by directed self-assembly using a block copolymer that includes blocks having different properties from one another has been known (see Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383). In addition, a method of forming a fine pattern by permitting directed self-assembly of a composition that contains a plurality of polymers having properties that are different from one another has been also known (see U.S. Patent Application, Publication No. 2009/0214823, and Japanese Unexamined Patent Application, Publication No. 2010-58403). According to these methods, annealing of a film containing the polymer results in a tendency of clustering of polymer structures having the same property, and thus a pattern can be formed in a self-aligning manner.

It has been known that in such a directed self-assembly lithography process, formation of a film containing a component such as a polymer which should be subjected to the directed self-assembly on other layer may effectively cause phase separation owing to the directed self-assembly. A variety of studies have been made in connection with the layer, and formation of a variety of phase separation structures is reportedly enabled by appropriately controlling the surface free energy of the layer in permitting the directed self-assembly of the block copolymer (see Japanese Unexamined Patent Application, Publication No. 2008-36491, and Japanese Unexamined Patent Application, Publication No. 2012-174984).

SUMMARY OF THE INVENTION

According to one aspect of the present invention, a composition for a base of a directed self-assembling film includes a compound including an oxo acid group, and a solvent.

According another aspect of the present invention, a directed self-assembly lithography method includes subjecting a substrate to a base treatment using the composition. The substrate includes a silicon atom or is coated with a metal-containing film provided on a surface of the substrate. A directed self-assembling film including a plurality of phases is overlaid on the substrate subjected to the base treatment. At least a part of the plurality of phases of the directed self-assembling film is removed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

According to an embodiment of the present invention, a composition for a base of a directed self-assembling film contains: a compound having an oxo acid group; and a solvent.

According to another embodiment of the present invention, a directed self-assembly lithography method includes the steps of: subjecting a substrate to a base treatment using the composition for a base; overlaying a directed self-assembling film including a plurality of phases on the substrate subjected to the base treatment; and removing at least a part of the plurality of phases of the directed self-assembling film, in which the process is characterized in that the substrate is a silicon-containing substrate or a substrate having a metal-containing film formed on the upper face side thereof, and that as the composition for a base, the aforementioned composition for a base is used.

The term "directed self-assembling" or "directed self assembly" as referred to means a phenomenon of spontaneously constructing a tissue or a structure without resulting from only the control from an external factor.

The "organic group" as referred to means a group that includes at least one carbon atom. The "hydrocarbon group" as referred to involves a chain hydrocarbon group, an alicyclic hydrocarbon group and an aromatic hydrocarbon group. The "hydrocarbon group" may be either a saturated hydrocarbon group, or an unsaturated hydrocarbon group.

According to the composition for a base and the directed self-assembly lithography method of the embodiments of the present invention, a phase separation structure through directed self-assembly can be favorably formed, and a pattern with rectangularity, that is, having a cross-sectional shape that is superior in rectangularity, (i.e., tailing of a pattern configuration is reduced) can be formed. Therefore, these can be suitably used for lithography processes in manufacture of various types of electronic devices such as semiconductor devices and liquid crystal devices for which further microfabrication is demanded.

Hereinafter, embodiments of the composition for a base and the directed self-assembly lithography method of the present invention will be described in detail.

Composition for Base

The composition for a base is used for surface preparation (or forming a base) of a directed self-assembling film in a directed self-assembly lithography process through subjecting the substrate to a base treatment.

The composition for a base contains a compound having an oxo acid group (hereinafter, may be also referred to as "(A) compound" or "compound (A)"), and a solvent (hereinafter, may be also referred to as "(B) solvent" or "solvent (B)"). In addition, the composition for a base may contain as a favorable component, an acid generating agent (hereinafter, may be also referred to as "(C) acid generating agent" or "acid generating agent (C)"), and/or may contain other optional component(s), within a range not leading to impairment of the effects of the present invention. Furthermore, the "compound" also involves in addition to a compound having a low molecular weight, a polymer, an oligomer, and the like. The composition for a base contains the compound (A) as a non-salt compound in a solvent fundamentally including an organic solvent, and is for use in a base treatment. Thus, the composition for a base is different from an aqueous solution of a surfactant, and the like used as a washing agent and/or a levelling agent of the substrate. Hereinafter, each component will be explained.

(A) Compound

The compound (A) has an oxo acid group. The "oxo acid group" as referred to means a group having a structure in which a hydrogen atom dissociable as a proton bonds to an oxygen atom. The oxo acid group does not include salt forms given by substituting the hydrogen atom bonding to the oxygen atom with a metal atom or the like.

According to the composition for a base, due to the compound (A) having the oxo acid group, strong binding is enabled with, for example, Si—OH, Si—H or the like of the surface of a silicon-containing substrate, a metal atom of the surface of a metal-containing film including $ZrO_2$, $TiO_2$, $Al_2O_3$, $SiO_2$, $HfO_2$, $Fe_2O_3$, ZnO, SiN or the like formed on the upper face side of the substrate, and the like. As a result, the compound (A) is prevented from uneven distribution in the base through aggregation of the compound molecules, and therefore, use of the composition for a base enables a phase separation structure through directed self-assembly to be favorably formed, and possible formation of a pattern with rectangularity is expected.

Examples of the oxo acid group include a phosphoric acid group, a phosphono group, a sulfo group, a sulfuric acid group, a carboxy group, and the like. Of these, in light of stability of the compound (A), a phosphono group, a sulfo group and a carboxy group are preferred, and in light of achieving a stronger bonding with a metal atom and the like of the surface of the metal-containing film through, for example, including two OH groups, or the like, a phosphono group is more preferred.

The compound (A) is preferably a compound represented by the following formula (1).

In the above formula (1), A represents an organic group having 10 or more carbon atoms and having a valency of n; B represents an oxo acid group; and n is an integer of 1 to 200, wherein in a case where n is 2 or greater, a plurality of Bs are identical or different.

The organic group having 10 or more carbon atoms and having a valency of n represented by A is exemplified by: hydrocarbon groups having 1 to 30 carbon atoms and having a valency of n; hetero atom-containing groups that include a group having a hetero atom between two adjacent carbon atoms of the hydrocarbon group having 1 to 30 carbon atoms and having a valency of n; groups obtained by substituting with a substituent, a part or all of hydrogen atoms of the hydrocarbon groups having 1 to 30 carbon atoms and having a valency of n or the hetero atom-containing group, and the like.

The hydrocarbon group having 1 to 30 carbon atoms and having a valency of n is exemplified by chain hydrocarbon groups having 1 to 30 carbon atoms and having a valency of n, alicyclic hydrocarbon groups having 3 to 30 carbon atoms and having a valency of n, aromatic hydrocarbon groups having 6 to 30 carbon atoms and having a valency of n, and the like.

When n is 1, examples of the monovalent chain hydrocarbon group include:

alkyl groups such as a methyl group, an ethyl group, a n-propyl group, an i-propyl group, a n-butyl group, an i-butyl group, a sec-butyl group, a t-butyl group, a decyl group and an undecyl group;

alkenyl groups such as an ethenyl group, a propenyl group, a butenyl group, a decenyl group and an undecenyl group;

alkynyl groups such as an ethynyl group, a propynyl group, a butynyl group, a decynyl group and an undecynyl group; and the like.

Examples of the monovalent alicyclic hydrocarbon group include:

cycloalkenyl groups such as a cyclopropyl group, a cyclobutyl group, a cyclopentyl group, a cyclohexyl group, a norbornyl group, an adamantyl group, a tricyclodecyl group and a tetracyclododecyl group;

cycloalkenyl groups such as a cyclopropenyl group, a cyclobutenyl group, a cyclopentenyl group, a cyclohexenyl group, a norbornenyl group and a tricyclodecenyl group; and the like.

Examples of the monovalent aromatic hydrocarbon group include:

aryl groups such as a phenyl group, a tolyl group, a xylyl group, a mesityl group, a naphthyl group and an anthryl group;

aralkyl groups such as a benzyl group, a phenethyl group, a phenylmethyl group, a naphthylmethyl group and an anthryl methyl group; and the like.

Examples of the hetero atom of the hetero atom-containing group include an oxygen atom, a nitrogen atom, a sulfur atom, a phosphorus atom, and the like.

Examples of the hetero atom-containing group include —O—, —CO—, —NR'—, —S—, —CS—, and the like. R' represents a monovalent hydrocarbon group having 1 to 20 carbon atoms.

Examples of the substituent include halogen atoms such as a fluorine atom, a chlorine atom, a bromine atom and an iodine atom; a hydroxy group; a carboxy group; a cyano group; a nitro group; and the like.

When n is 2 or greater, the organic group having a valency of n is exemplified by groups obtained by removing (n−1) hydrogen atoms from the monovalent organic group exemplified above, and the like.

A in the above formula (1) is further exemplified by organic groups having 10 to 30 carbon atoms and having a valency of n, polymer chains having 30 or more carbon atoms, and the like.

The compound (A) is preferably a compound represented by the above formula (1), wherein n is 1; and the oxo acid group represented by B bonds to the end of the organic group represented by A. In this instance, the base obtained by the composition for a base is considered to have a structure composed of aggregates of, for example, the compound (A) which bonds to the surface of the substrate with the oxo acid group, whereas the organic group represented by A is positioned above the substrate.

In addition, in another preferred compound (A), n in the above formula (1) is an integer of 2 to 200. In this instance, the resultant base is considered to have a structure composed of, for example, the compound (A) which bonds to the surface of the substrate with a plurality of oxo acid groups, whereas the organic group represented by A is positioned above the substrate.

When the compound (A) is a polymer, it may be either a random copolymer or a block copolymer, but a random copolymer is preferred in light of enabling the oxo acid group and other structural unit to be situated with a more homogenously dispersed state, consequently leading to a more favorable phase separation structure through directed self-assembling, whereby a pattern with further rectangularity can be obtained.

Synthesis Method of Compound (A)

Although a chain compound to which an oxo acid group bonds at the end, etc., a commercially available product, etc., for example, may be used as the compound (A), the compound (A) may be synthesized in accordance with a well-known polymerization method as shown below.

A polymerization method for synthesizing the compound (A) may involve any one of radical polymerization, anion polymerization, NMP (Nitroxide-Mediated Polymerization), ATRP (Atom Transfer Radical Polymerization) and RAFT (Reversible Addition-Fragmentation chain Transfer), and in light of the advantages that the polymer of the compound (A) having a more desired structure can be obtained by utilizing chain transfer or the like, and that a random copolymer can be easily obtained, the radical polymerization is preferably involved.

The compound (A) represented by the above formula (1) in which n is 1, and the oxo acid group represented by B bonds to the end of the organic group represented by A can be obtained by, for example, polymerizing a vinyl monomer in the presence of a chain transfer agent that includes a compound having an oxo acid group and a mercapto group at the end of the organic group, and a radical polymerization initiator in a solvent. Alternatively, such a compound (A) can be also synthesized by polymerizing a vinyl monomer using an initiator that includes: a halide having the oxo acid group such as methyl bromoisobutyrate phosphonic acid; copper (I) bromide; and a compound which can be a ligand such as N,N,N',N'',N''-pentamethyldiethylenetriamine.

The compound (A) represented by the above formula (1) in which n is an integer of 2 to 200 can be obtained by, for example, polymerizing using a vinyl monomer having an oxo acid group and other vinyl monomer in the presence of a radical polymerization initiator in a solvent. In this case, the other vinyl monomer may include a chain transfer agent consisting of a vinyl monomer having a mercapto group such as mercapto-undecene. Thus, the compound (A) having more oxo acid groups which are more three dimensionally arranged can be obtained.

Examples of the chain compound having the oxo acid group bonded at the end include:

chain compounds having a phosphoric acid group at the end such as decylphosphoric acid, dodecylphosphoric acid and polyethylene glycol dodecylphosphoric acid;

chain compounds having a phosphono group at the end such as decyl phosphonic acid, dodecyl phosphonic acid and polyethylene glycol dodecyl phosphonic acid;

chain compounds having a sulfo group at the end such as decyl sulfonic acid, dodecyl sulfonic acid and polyethylene glycol dodecyl sulfonic acid;

chain compounds having a sulfuric acid group at the end such as decylsulfuric acid, dodecylsulfuric acid and polyethylene glycol dodecylsulfuric acid;

chain compounds having a carboxy group at the end such as decanoic acid, undecanoic acid, dodecanoic acid, tridecanoic acid, polyethylene glycol dodecanoic acid, and the like.

Examples of the compound having an oxo acid group and a mercapto group include:

compounds having a phosphoric acid group such as 3-mercapto-1-propane phosphoric acid, 10-mercaptodecanyl phosphoric acid and 12-mercaptododecanyl phosphoric acid;

compounds having a phosphono group such as 3-mercapto-1-propane phosphonic acid, 10-mercaptodecanyl phosphonic acid and 12-mercaptododecanyl phosphonic acid;

compounds having a sulfo group such as 3-mercapto-1-propanesulfonic acid, 10-mercaptodecanyl sulfonic acid and 12-mercaptododecanyl sulfonic acid;

compounds having a sulfuric acid group such as 3-mercapto-1-propane sulfuric acid, 10-mercaptodecanyl sulfuric acid and 12-mercaptododecanyl sulfuric acid;

compounds having a carboxy group such as 3-mercaptopropionic acid, 4-mercaptobutyric acid, 11-mercapto-undecanoic acid and 13-mercapto-undecanoic acid; and the like.

Examples of the vinyl monomer having an oxo acid group include:

monomers having a phosphoric acid group such as 10-phosphoric acid decanyl (meth)acrylate, 12-phosphoric acid dodecanyl (meth)acrylate, phosphoric acid methylstyrene, 4-vinylphenylmethylene phosphoric acid, vinyl phosphoric acid and vinylbenzene phosphoric acid;

monomers having a phosphono group such as 10-phosphonic acid decanyl (meth)acrylate, 12-phosphonic acid dodecanyl (meth)acrylate, phosphonic acid methylstyrene, 4-vinylphenylmethylene phophonic acid, vinyl phosphonic acid and vinylbenzene phosphonic acid;

monomers having a sulfo group such as 10-sulfodecanyl (meth)acrylate, 12-sulfododecanyl (meth)acrylate, sulfomethylstyrene, 4-vinylphenylmethylenesulfonic acid, vinyl sulfonic acid and vinylbenzenesulfonic acid;

monomers having a sulfuric acid group such as 10-sulfuric acid decanyl (meth)acrylate, 12-sulfuric acid dodecanyl (meth)acrylate, sulfuric acid methylstyrene, 4-vinylphenylmethylene sulfuric acid, vinyl sulfuric acid and vinylbenzenesulfuric acid;

monomers having a carboxy group such as 10-carboxydecanyl (meth)acrylate, 12-carboxydodecanyl (meth)acrylate, carboxymethylstyrene, 4-vinylphenylmethylene carboxylic acid, (meth)acrylic acid, crotonic acid and vinylbenzoic acid; and the like.

Of these, monomers having a phosphono group, monomers having a sulfo group and monomers having a carboxy group are preferred, and 12-phosphonic acid dodecanyl (meth)acrylate, 4-vinylphenylmethylene phophonic acid, methacrylic acid, vinylbenzoic acid and vinyl sulfonic acid are more preferred.

Examples of the vinyl monomer include:

olefin monomers such as ethylene, propylene, butene, pentene, hexene and heptene;

vinyl aromatic monomers such as styrene, vinylnaphthalene, vinylbiphenyl and α-methylstyrene;

aliphatic (meth)acrylates such as methyl (meth)acrylate, ethyl (meth)acrylate, n-propyl (meth)acrylate, i-propyl (meth)acrylate, n-butyl (meth)acrylate, i-butyl (meth)acrylate, t-butyl (meth)acrylate, 2-ethylhexyl (meth)acrylate, isooctyl (meth)acrylate, isodecyl (meth)acrylate, lauryl (meth)acrylate, stearyl (meth)acrylate, 2-acetoacetoxyethyl (meth)acrylate and 2-hydroxyethyl (meth)acrylate;

alicyclic (meth)acrylates such as cyclopropyl (meth)acrylate, cyclobutyl (meth)acrylate, cyclopentyl (meth)acrylate, cyclohexyl (meth)acrylate, dicyclopentenyl (meth)acrylate, dicyclopentenyloxy (meth)acrylate, dicyclopentanyl (meth)acrylate, norbornyl (meth)acrylate and adamantyl (meth)acrylate;

aromatic (meth)acrylates such as benzyl (meth)acrylate, phenyl (meth)acrylate and naphthyl (meth)acrylate;

halogen-containing monomers such as vinyl fluoride, vinyl chloride, vinyl bromide, vinyl iodide, vinylidene fluoride and vinylidene chloride;

carboxylic acid monomers such as (meth)acrylic acid and maleic acid;

monomers having a polar group such as an acid anhydride group, a phosphoric acid group, a sulfonic acid group, a hydroxy group, an aldehyde group, an amino group, an amide group, an epoxy group, an acetoacetoxy group, an isocyanate group or an isothiocyanate group; and the like.

Of these, in light of further inhibition of uneven distribution of the compound (A), vinyl aromatic monomers, aliphatic (meth)acrylates and aromatic (meth)acrylates are preferred; vinyl aromatic monomers and aliphatic (meth)acrylates are more preferred; styrene, methyl methacrylate, cyclohexyl methacrylate, dicyclopentanyl methacrylate, 2-acetoacetoxyethyl methacrylate and 2-hydroxyethyl methacrylate are still more preferred; and styrene and methyl methacrylate are particularly preferred.

When the compound (A) represented by the above formula (1) in which n is an integer of 2 to 200 is synthesized, the lower limit of the proportion of the vinyl monomer having an oxo acid group used with respect to the total vinyl monomer is preferably 0.01 mol %, more preferably 0.1 mol %, still more preferably 0.3 mol %, and particularly preferably 0.5 mol %. The upper limit of the proportion is preferably 50 mol %, more preferably 20 mol %, still more preferably 10 mol %, and particularly preferably 5 mol %. When the proportion of the vinyl monomer having an oxo acid group used falls within the above range, uneven distribution of the compound (A) in the base tends to be further inhibited.

Examples of the radical polymerization initiator include:

azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), dimethyl 2,2'-azobisisobutyrate and 2,2'-azobis(2-methylpropionitrile);

peroxide radical initiators such as benzoyl peroxide, t-butyl hydroperoxide, cumene hydroperoxide and t-butylperoxy-2-ethylhexanoate; and the like. These may be used alone, or two or more types thereof may be used in combination.

Of these, the radical polymerization initiator is preferably 2,2'-azobis(2-methylpropionitrile), t-butylperoxy-2-ethylhexanoate and 2,2'-azobis(2,4-dimethylvaleronitrile).

Examples of the solvent which may be used in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

saturated carboxylic acid esters such as ethyl acetate, n-butyl acetate, i-butyl acetate and methyl propionate;

ketones such as acetone, methyl ethyl ketone, 4-methyl-2-pentanone and 2-heptanone;

ethers such as tetrahydrofuran, dimethoxyethanes and diethoxyethanes;

alcohols such as methanol, ethanol, 1-propanol, 2-propanol and 4-methyl-2-pentanol; and the like. These may be used alone, or two or more types thereof may be used in combination.

Of these, the solvent for use in the polymerization is preferably ketones, and more preferably methyl ethyl ketone.

The reaction temperature in the polymerization is preferably 40° C. to 150° C., and more preferably 50° C. to 120° C. On the other hand, the reaction time period is preferably 1 hr to 48 hrs, and more preferably 1 hr to 24 hrs.

The reaction solution after the polymerization is preferably prepared to give a 5 to 15% by mass solution with a solvent such as propylene glycol monomethyl ether acetate, in light of handleability.

The lower limit of the polystyrene equivalent weight average molecular weight (Mw) of the compound (A) as determined by gel permeation chromatography (GPC) is preferably 1,000, more preferably 2,000, still more preferably 3,000, particularly preferably 4,000, and yet more particularly preferably 5,000. The upper limit of the Mw is preferably 50,000, more preferably 30,000, still more preferably 20,000, and particularly preferably 15,000. When the Mw of the compound (A) falls within the above range, uneven distribution of the compound (A) tends to be further reduced.

The lower limit of the polystyrene equivalent number average molecular weight (Mn) of the compound (A) as determined by gel permeation chromatography (GPC) is preferably 900, more preferably 1,900, still more preferably 2,900, particularly preferably 3,800, and even more particularly preferably 4,700. The upper limit of the Mn is preferably 49,000, more preferably 29,000, still more preferably 19,000, and particularly preferably 14,000. When the Mn of the compound (A) falls within the above range, uneven distribution of the compound (A) tends to be further reduced.

The ratio (Mw/Mn) of the Mw to the polystyrene equivalent number average molecular weight (Mn) as determined by GPC of the compound (A) is preferably no less than 1 and no greater than 5, more preferably no less than 1 and no greater than 3, still more preferably no less than 1 and no greater than 2.5, particularly preferably no less than 1 and no greater than 2, and even more particularly preferably no less than 1 and no greater than no greater than 1.5. When the ratio Mw/Mn of the compound (A) falls within the above range, uneven distribution of the compound (A) tends to be further reduced.

As referred to herein, the Mw and the Mn are determined by gel permeation chromatography (GPC) using GPC columns ("G2000 HXL"×2, "G3000 HXL"×1 and "G4000 HXL"×1 available from Tosoh Corporation) under analytical conditions involving the eluent of tetrahydrofuran, the flow rate of 1.0 mL/min and the column temperature of 40° C., with mono-dispersed polystyrene as a standard.

The content of the compound (A) in the total solid content of the composition for a base is preferably no less than 70% by mass, more preferably no less than 80% by mass, and still more preferably no less than 85% by mass. It is to be noted that the compound (A) may be used alone, or two or more types thereof may be used in combination.

(B) Solvent

The composition for a base contains the solvent (B). As the solvent (B), an organic solvent is preferably used. The organic solvent is exemplified by an alcohol solvent, an ether solvent, a ketone solvent, an amide solvent, an ester solvent, a hydrocarbon solvent, and the like.

Examples of the alcohol solvent include:

aliphatic monohydric alcohol solvents having 1 to 18 carbon atoms such as 4-methyl-2-pentanol and n-hexanol;

alicyclic monohydric alcohol solvents having 3 to 18 carbon atoms such as cyclohexanol;

polyhydric alcohol solvents having 2 to 18 carbon atoms such as 1,2-propylene glycol;

polyhydric alcohol partially etherified solvents having 3 to 19 carbon atoms such as propylene glycol monomethyl ether; and the like.

Examples of the ether solvent include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonyl acetone, acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents such as butyl acetate, ethyl lactate, butoxyethyl acetate and methoxybutyl acetate;

polyhydric alcohol carboxylate solvents such as propylene glycol acetate;

polyhydric alcohol partially etherified carboxylate solvents such as propylene glycol monomethyl ether acetate;

polyvalent carboxylic acid diester solvents such as diethyl oxalate;

carbonate solvents such as dimethyl carbonate and diethyl carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

These may be used alone, or two or more types thereof may be used in combination.

Of these, the solvent (B) is preferably an alcohol solvent, an ester solvent and a ketone solvent, more preferably a polyhydric alcohol partially etherified solvent having 3 to 19 carbon atoms, a monocarboxylic acid ester solvent and a cyclic ketone solvent, and still more preferably propylene glycol monomethyl ether acetate, methoxybutyl acetate, butyl acetate and cyclohexanone.

The lower limit of the content of the solvent (B) with respect to 100 parts by mass of the compound (A) is preferably 5,000 parts by mass, more preferably 10,000 parts by mass, still more preferably 20,000 parts by mass, and particularly preferably 50,000 parts by mass. On the other hand, the upper limit of the content of the solvent (B) with respect to 100 parts by mass of the compound (A) is preferably 500,000 parts by mass, more preferably 300,000 parts by mass, still more preferably 200,000 parts by mass, and particularly preferably 150,000 parts by mass. When the content of the solvent (B) falls within the above range, the compound (A) can be dispersed in the solvent (B).

(C) Acid Generating Agent

The acid generating agent (C) is component that generates an acid upon an exposure or heating. Due to containing the acid generating agent (C), the composition for a base can promote a reaction between the compound (A) and Si—OH, Si—H, metal atoms or the like on the surface of the substrate, and consequently further inhibit uneven distribution of the compound (A), whereby a phase separation structure can be more favorably formed through directed self-assembly, and thus formation of a pattern with further rectangularity is enabled.

Examples of the acid generating agent (C) include:

sulfonium salts such as triphenylsulfonium trifluoromethanesulfonate, triphenylsulfonium 2-(adamantan-1-ylcarbonyloxy)-1,1,3,3,3-pentafluoropropane-1-sulfonate, triphenylsulfonium norbornanesulton-2-yloxycarbonyldifluoromethanesulfonate, triphenylsulfonium piperidin-1-ylsulfonyl-1,1,2,2,3,3-hexafluoropropane-1-sulfonate, triphenylsulfonium adamantan-1-yloxycarbonyldifluoromethanesulfonate, 4-cyclohexylphenyldiphenylsulfonium camphorsulfonate, 4-methanesulfonylphenyldiphenylsulfonium nonafluoro-n-butanesulfonate and triphenylsulfonium 2-(bicyclo[2.2.1]hept-2-yl)-1,1,2,2-tetrafluoroethane-1-sulfonate;

tetrahydrothiophenium salts such as 1-(4-n-butoxynaphthalen-1-yl)tetrahydrothiophenium trifluoromethanesulfonate, 1-(6-n-butoxynaphthalen-1-yl)tetrahydrothiophenium 2-bicyclo[2.2.1]hept-2-yl-1,1,2,2-tetrafluoroethane-1-sulfonate and 1-(3,5-dimethyl-4-hydroxyphenyl)tetrahydrothiophenium camphorsulfonate;

N-sulfonyloxyimide compounds such as N-(trifluoromethanesulfonyloxy)bicyclo[2.2.1]hept-5-ene-2,3-dicarboxyimide and N-(camphorsulfonyloxy)bicyclo[2.2.1]hept-5-ene-2,3-dicarboxyimide;

iodonium salts such as diphenyliodonium trifluoromethanesulfonate, bis(4-t-butylphenyl)iodonium trifluoromethanesulfonate, bis(4-t-butylphenyl)iodonium nonafluoro-n-butanesulfonate and 4-methoxyphenylphenyliodonium camphorsulfonate; and the like.

These may be used alone, or two or more types thereof may be used in combination.

Preferred anion species included in the acid generating agent (C) may include a fluorinated sulfonic acid anion.

Preferred cation species included in the acid generating agent (C) may include a sulfonium cation and an iodonium cation.

The acid generating agent (C) is preferably a sulfonium salt or an iodonium salt, more preferably a triphenylsulfonium salt or a di(4-t-butylphenyl)iodonium salt, and still more preferably triphenylsulfonium 2-(norbornan-2-yl)-1,1,2,2-tetrafluoroethane-1-sulfonate or di(4-t-butylphenyl)iodonium nonafluorobutanesulfonate.

The lower limit of the content of the acid generating agent (C) with respect to 100 parts by mass of the compound (A) is preferably 1 part by mass, more preferably 5 parts by mass, still more preferably 10 parts by mass, and particularly preferably 20 parts by mass. On the other hand, the upper limit of the content of the acid generating agent (C) with respect to 100 parts by mass of the compound (A) is preferably 300 parts by mass, more preferably 200 parts by mass, still more preferably 100 parts by mass, and particularly preferably 80 parts by mass. When the content of the acid generating agent (C) falls within the above range, uneven distribution of the compound (A) can be further inhibited, and consequently a phase separation structure can be more favorably formed through directed self-assembly, and thus formation of a pattern with further rectangularity is enabled.

Other Optional Component

The composition for a base may contain other optional component in addition to the components described above. The other optional component involves, for example, a surfactant, and the like.

Surfactant

A surfactant is a component that enables application properties onto a substrate, etc., to be improved. The content of the surfactant with respect to 100 parts by mass of the compound (A) is preferably no greater than 2 parts by mass, and more preferably no greater than 1.5 parts by mass.

Preparation Method of Composition for a Base

The composition for a base can be prepared by, for example, mixing the compound (A), the solvent (B), the acid generating agent (C) and the like at a given ratio. Moreover, the lower limit of the solid content concentration of the composition for a base is preferably 0.01% by mass, more preferably 0.02% by mass, still more preferably 0.05% by mass, particularly preferably 0.08% by mass, and even more particularly preferably 0.1% by mass. The upper limit of the solid content concentration is preferably 30% by mass, more preferably 10% by mass, still more preferably 3% by mass, particularly preferably 1% by mass, and even more particularly preferably 0.5% by mass.

Directed Self-Assembly Lithography Process

According to the directed self-assembly lithography process, a film having a phase separation structure through directed self-assembly (directed self-assembling film including a plurality of phases) is formed by a procedure such as, e.g., applying a directed self-assembling composition on a certain base, and a part of the plurality of phases in the directed self-assembling film are removed, whereby a pattern can be formed through directed self-assembly.

The directed self-assembly lithography process includes, for example:

the step of subjecting a substrate to a base treatment using a composition for a base (hereinafter, may be also referred to as "base treatment step");

the step of overlaying a directed self-assembling film including a plurality of phases on the substrate subjected to the base treatment (hereinafter, may be also referred to as "directed self-assembling film overlaying step"); and the step of removing at least a part of the plurality of phases of the directed self-assembling film (hereinafter, may be also referred to as "removing step"). As the substrate, a silicon-containing substrate or a substrate having a metal-containing film formed on the upper face side thereof may be used.

In this method, the above-described composition for a base may be used as the composition for a base.

The directed self-assembly lithography process may include after the base treatment step and before the directed self-assembling film overlaying step, the step of forming a prepattern on the substrate subjected to the base treatment (hereinafter, may be also referred to as "prepattern-forming step").

The directed self-assembly lithography process may include after the removing step, the step of forming a substrate pattern (hereinafter, may be also referred to as "substrate pattern-forming step"). Each step will be explained below with reference to FIGS. 1 to 5.

Base Treatment Step

Figure 1:
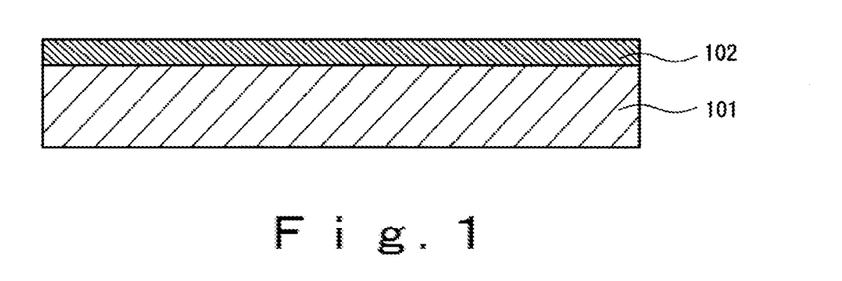
FIG. 1 shows a schematic cross sectional view illustrating one example of a state after providing a base on a substrate.

In this step, a substrate 101 is subjected to a base treatment using a composition for a base. As the substrate 101, a silicon-containing substrate or a substrate having a metal-containing film formed on the upper face side thereof may be used. By carrying out this step, the substrate 101 provided with a base 102 thereon as shown in FIG. 1, i.e., the substrate subjected to the base treatment is obtained. The directed self-assembling film 105 is formed through overlaying on the base 102. In the directed self-assembling film 105, as a result of subjecting the substrate 101 to the base treatment for forming the phase separation structure (microdomain structure), control of the structure is enabled, whereby a phase separation structure through directed self-assembly can be conveniently and favorably formed, and a pattern with rectangularity and the like can be formed.

The silicon-containing substrate is not particularly limited as long as a silicon atom is contained, and for example, a silicon substrate such as a silicon wafer, a metal substrate having a siloxane film formed thereon, and the like may be exemplified. Of these, a silicon substrate is preferred, and a silicon wafer is more preferred. It is to be noted that the silicon-containing substrate commonly has Si—OH or Si—H on the surface thereof due to an action of oxygen, water and the like in the air. In addition, by subjecting the silicon-containing substrate to a surface treatment with an acid such as sulfuric acid, Si—OH or Si—H may be provided on the surface thereof.

Moreover, the metal-containing film is not particularly limited as long as a metal atom is contained, and for example, a film formed from $ZrO_2$, $TiO_2$, $Al_2O_3$ or the like, a film formed from a composition containing a hydrolytic condensation product of a metal, and the like may be exemplified.

Although the procedure of the base treatment is not particularly limited, for example, the procedure may include e.g., applying the composition for a base on the substrate 101 by a well-known method such as a spin-coating method to provide a coating film, and curing the coating film by subjecting to heating or an exposure; and the like. Examples of the radioactive ray which may be employed for the exposure include visible light rays, ultraviolet rays, far ultraviolet rays, X-rays, electron beams, γ-rays, molecular beams, ion beams, and the like. For curing the coating film, heating alone, an exposure alone, or both heating and an exposure may be carried out. When the composition for a base does not include the acid generating agent (C), it is preferred that heating is carried out, in other words, heating alone, or both heating and an exposure may be carried out in light of sufficient formation of bonding of the oxo acid group to the surface of the substrate, and also in light of ensuring sufficient curing of the coating film. When the composition for a base contains the acid generating agent (C), the exposure and/or heating may be selected and carried out taking into consideration the type of the radiation-sensitive acid generating agent/heat acid generating agent as the acid generating agent (C). In light of further acceleration of the curing of the coating film, heating is preferably carried out irrespective of whether or not the acid generating agent (C) is contained in the composition for a base.

The temperature in heating the coating film is preferably no less than 100° C. and no greater than 400° C., and more preferably no less than 120° C. and no greater than 350° C. The time period of heating of the coating film is preferably no less than 10 sec and no greater than 600 sec, and more preferably no less than 30 sec and no greater than 300 sec. When the heating temperature and the heating time period in the base treatment falls within the above range, uneven distribution of the compound (A) can be further inhibited. The atmosphere in heating the coating film is not particularly limited, and the heating may be conducted in an air atmosphere, or in an inert gas atmosphere such as in a nitrogen gas. In addition, after the heating of the coating film, washing with a solvent may be carried out.

The film thickness of the base 102 is preferably 5 nm to 2,000 nm, more preferably 10 nm to 100 nm, and still more preferably 15 nm to 50 nm.

After the curing, the surface of the substrate subjected to the base treatment is preferably washed with, for example, a 2.38% by mass aqueous tetramethylammonium hydroxide solution in order to remove the compound (A) and the like not interacted with the surface of the substrate. Washing in this manner enables a phase separation structure through directed self-assembly to be more favorably formed, and it is likely to enable a pattern with further rectangularity to be formed.

The lower limit of the receding contact angle relative to pure water of the surface of the substrate subjected to the base treatment, after the exposure and before the washing is preferably 50°, more preferably 55°, and still more preferably 58°. On the other hand, the upper limit of the receding contact angle is preferably 75°, more preferably 70°, and still more preferably 65°. When the receding contact angle after the exposure and before the washing falls within the above range, the phase separation structure through directed self-assembly can be more favorably formed, and it is likely to enable a pattern with further rectangularity to be formed.

Prepattern-Forming Step

Figure 2:
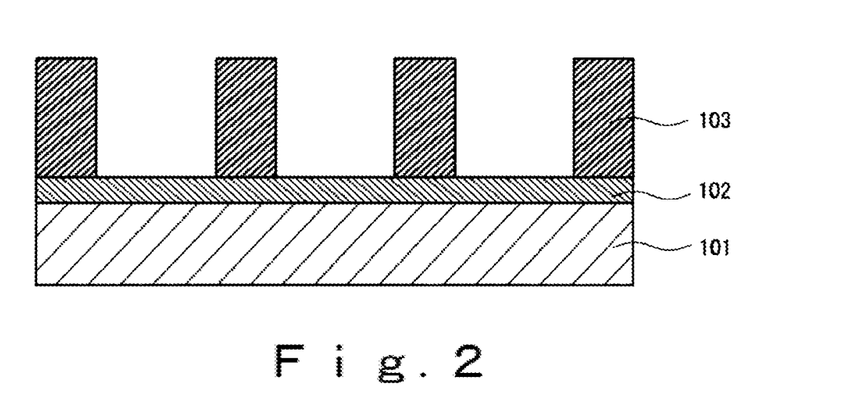
FIG. 2 shows a schematic cross sectional view illustrating one example of a state after forming a prepattern on the base.

In this step, as shown in FIG. 2, a prepattern 103 is formed on the base 102. By carrying out this step, phase separation in forming the directed self-assembling film 105 can be further controlled, thereby enabling a phase separation structure through directed self-assembly to be more favorably formed. More specifically, among the components etc., forming the directed self-assembling film 105, the components etc., having a higher affinity to a lateral face of the prepattern 103 form phases along the prepattern 103, whereas the components etc., having a lower affinity form phases at positions away from the prepattern 103. Accordingly, a phase separation structure through directed self-assembly can be more favorably formed. In addition, according to the material, length, thickness, shape, etc. of the prepattern 103, the formed phase separation structure can be more minutely controlled. Moreover, the prepattern 103 may be partially modified by a partial exposure, laser ablation, and the like. It is to be noted that the prepattern 103 may be appropriately selected depending on the pattern intended to be finally formed, and, for example, a line-and-space pattern, a hole pattern, a pillar pattern, and the like may be employed.

As the method for forming the prepattern 103, those similar to well-known resist pattern-forming methods, and the like may be employed. In addition, a conventional composition for resist film formation may be used as the composition for prepattern formation. In a specific method for formation of the prepattern 103, for example, a chemical amplification resist composition such as "ARX2928JN" available from JSR Corporation is coated on the base 102 to provide a resist film. Next, an exposure is carried out by irradiating a desired region of the resist film with a radioactive ray through a mask having a specific pattern. Examples of the radioactive ray include: far ultraviolet rays such as ArF excimer laser beams and KrF excimer laser beams; ultraviolet rays; electromagnetic waves such as X-rays; charged particle rays such as electron beams; and the like. Of these, far ultraviolet rays are preferred, ArF excimer laser beams and KrF excimer laser beams are more preferred, and ArF excimer laser beams are even more preferred. Subsequently, post exposure baking (PEB) is carried out, followed by development using a developer solution such as an alkaline developer solution, whereby a desired prepattern 103 can be formed.

It is to be noted that the surface of the prepattern 103 may be subjected to a hydrophobilization treatment or a hydrophilization treatment. In specific treatment methods, a hydrogenation treatment including exposing to hydrogen plasma for a certain time period, and the like may be adopted. An increase of the hydrophobicity or hydrophilicity of the surface of the prepattern 103 enables the aforementioned directed self-assembly to be accelerated.

Directed Self-Assembling Film Overlaying Step

Figure 3:
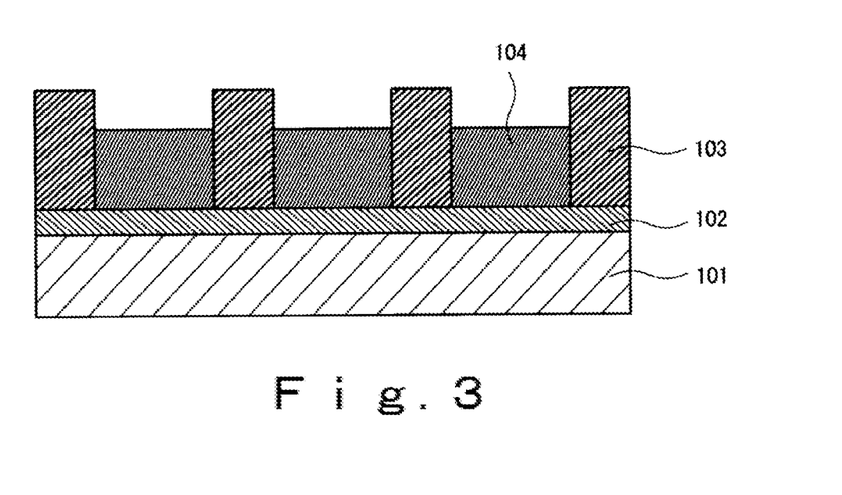
FIG. 3 shows a schematic cross sectional view illustrating one example of a state after providing a coating film between facing sides of the prepattern using a composition for a base.

In this step, a directed self-assembling film 105 is overlaid on the base 102. By carrying out this step, a substrate including the directed self-assembling film 105 overlaid on the base 102 can be obtained. The overlaying of the directed self-assembling film 105 can be executed by, for example, applying on the base 102, a directed self-assembling composition or the like containing a component capable of forming a phase separation structure through directed self-assembly to provide a coating film, and allowing for directed self-assembly of the component in the coating film. Also, in a case where the aforementioned prepattern 103 is employed, as shown in FIG. 3, the directed self-assembling composition is applied in a region on the base 102 compartmentalized by the prepattern 103 to provide a coating film, and the directed self-assembling film 105 having a phase separation structure is formed.

In forming the directed self-assembling film 105, after applying the directed self-assembling composition on the base 102 to provide a coating film, annealing or the like may be carried out, whereby portions having identical properties are assembled with one another to spontaneously form an ordered pattern, and thus directed self-assembly, as generally referred to, can be accelerated. Accordingly, a directed self-assembling film 105 having a phase separation structure can be formed on the base 102. The phase separation structure is preferably formed along the prepattern 103, and the boundaries formed by the phase separation are more preferably substantially parallel to a lateral face of the prepattern 103. For example, in a case where the prepattern 103 is a line pattern, a phase (105b) of components, etc., having a higher affinity to the prepattern 103 is formed along the prepattern 103, whereas a phase (105a) of other component, etc., is formed farthest away from the lateral face of the prepattern 103, i.e., at the central area of the region compartmentalized by the prepattern 103 to form a lamellar phase separation structure in which lamellar (platy) phases are alternately arranged. In a case where the prepattern 103 is a hole pattern, a phase of components, etc., having a higher affinity to the prepattern 103 is formed along a lateral face of the hole of the prepattern 103, whereas a phase of other component, etc., is formed at the central area of the hole. Further, in a case where the prepattern 103 is a pillar pattern, a phase of components, etc., having a higher affinity to the prepattern 103 is formed along a lateral face of the pillar of the prepattern 103, whereas a phase of other component, etc., is formed at a position away from each pillar. Formation of a desired phase separation structure is enabled by appropriately regulating the distance between pillars of the prepattern 103, as well as the structure and the blend proportion of the component such as each polymer in the directed self-assembling composition, and the like. It is to be noted that the phase separation structure formed in this step is configured with a plurality of phases, and the boundaries formed by these phases are, in general, substantially perpendicular to the substrate; however, the boundaries per se may not necessarily be clear. Thus, the resultant phase separation structure can be more strictly controlled by way of the structure and the blend proportion of the component of each compound, and the prepattern 103, in addition to the base 102, whereby a more desired fine pattern can be obtained.

The component capable of forming the phase separation structure through the directed self-assembly is not particularly limited as long as such a property is exhibited; however, for example, a block copolymer, a mixture of two or more types of polymers that are incompatible with one another, or the like may be involved. Of these, in light of a possibility of more favorably forming the phase separation structure, the component is preferably a block copolymer, more preferably a block copolymer that includes a styrene unit and a methacrylate ester unit, and still more preferably a diblock copolymer that includes a styrene unit and a methyl methacrylate unit.

Although the procedure for applying the directed self-assembling composition on the substrate to provide the coating film 104 is not particularly limited, for example, a procedure in which the directed self-assembling composition is applied by a spin coating etc., and the like may be involved. Accordingly, the directed self-assembling composition is applied between the prepatterns 103 on the base 102 to provide the coating film 104.

The annealing process may include, for example, heating at a temperature of preferably 80° C. to 400° C., more preferably 80° C. to 300° C., and still more preferably, 150° C. to 300° C. in an oven, on a hot plate, etc., and the like. The annealing time period is preferably 10 sec to 120 min, more preferably 30 sec to 60 min, and still more preferably 1 min to 20 min. The film thickness of the resulting directed self-assembling film 105 is preferably 0.1 nm to 500 nm, more preferably 0.5 nm to 100 nm, and still more preferably 1 nm to 50 nm.

Removing Step

Figure 4:
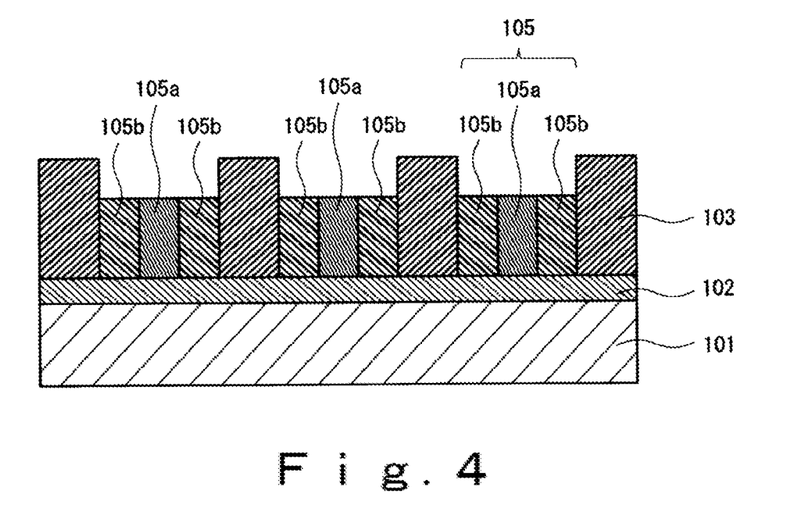
FIG. 4 shows a schematic cross sectional view illustrating one example of a state after converting the coating film to a directed self-assembling film.
Figure 5:
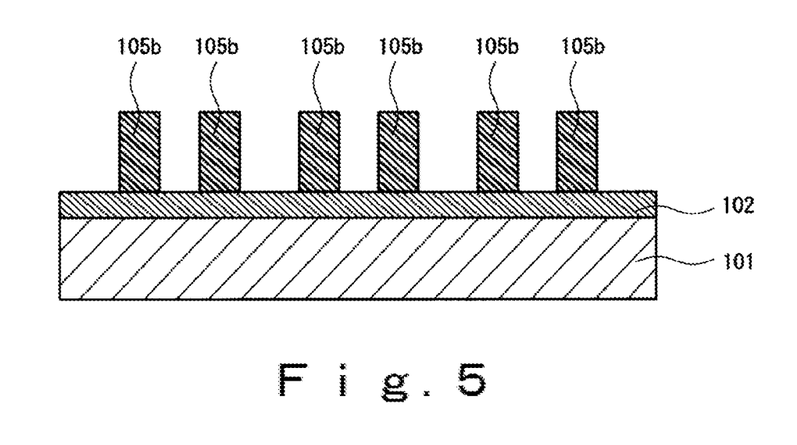
FIG. 5 shows a schematic cross sectional view illustrating one example of a state after removing a part of a plurality of phases of the directed self-assembling film and the prepattern.

In this step, as shown in FIGS. 4 and 5, at least a part of a plurality of phases of the directed self-assembling film 105 is removed. By carrying out this step, a part of a plurality of phases 105a can be removed in the phase separation structure included in the directed self-assembling film 105. Using the difference in the etching rate of each phase generated by phase separation through the directed self-assembly, a part of a plurality of phases can be removed by an etching treatment. In this procedure, the prepattern 103 may be also removed in a similar or distinct manner. A state attained after removing a part of the plurality of phases 105a in the phase separation structure, and the prepattern 103 is shown in FIG. 5.

As the procedure for removing the part of a plurality of phases 105a in the phase separation structure included in the directed self-assembling film 105, or the prepattern 103, well-known procedures e.g., reactive ion etching (RIE) such as chemical dry etching and chemical wet etching; physical etching such as sputter etching and ion beam etching; and the like may be exemplified. Among these, reactive ion etching (RIE) is preferred, and chemical dry etching carried out by using a $CF_4$ gas, an $O_2$ gas or the like, and chemical wet etching (wet development) carried out by using an etching solution such as hydrofluoric acid, or an organic solvent such as methyl isobutyl ketone (MIBK) or 2-propanol (IPA) are more preferred.

Substrate Pattern-Forming Step

In this step, a substrate pattern is formed. By carrying out this step, the base 102 and the substrate are etched to permit patterning by using as a mask, a pattern constituted with 105b, a part of a plurality of phases, of the phase separation film. After completion of the patterning onto the substrate, the phases used as the mask are removed from the substrate by a dissolving treatment or the like, whereby a patterned substrate (pattern) can be finally obtained. The pattern thus obtained is, for example, a line-and-space pattern, a hole pattern, a pillar pattern, and the like. As the procedure for the etching, a procedure similar to that in the above removing step may be employed, and the etching gas and the etching solution may be appropriately selected in accordance with the materials of the base 102 and the substrate. For example, in a case where the substrate is a silicon material, a gas mixture of chlorofluorocarbon-containing gas and $SF_4$, or the like may be used. Alternatively, in a case where the substrate is a metal film, a gas mixture of $BCl_3$ and $Cl_2$, or the like may be used. The pattern obtained according to the directed self-assembly lithography process is suitably used for semiconductor elements and the like, and further the semiconductor elements are widely used for LED, solar cells, and the like.

EXAMPLES

Hereinafter, the present invention is explained in detail by way of Examples, but the present invention is not in any way limited to these Examples. Measuring methods of physical properties are shown below.

Mw and Mn

The Mw and the Mn of the polymer were determined by gel permeation chromatography (GPC) using GPC columns ("G2000 HXL"×2, "G3000 HXL"×1, "G4000 HXL"×1, available from Tosoh Corporation) under the following condition:

eluent: tetrahydrofuran (Wako Pure Chemical Industries, Ltd.);
flow rate: 1.0 mL/min;
sample concentration: 1.0% by mass;
amount of sample injected: 100 μL;
column temperature: 40° C.;
detector: differential refractometer; and
standard substance: mono-dispersed polystyrene.

$^{13}$C-NMR Analysis $^{13}$C-NMR analysis was carried out using a nuclear magnetic resonance apparatus ("JNM-EX400", available from JEOL, Ltd.), with DMSO-d$_6$ as a solvent for the measurement. The proportion of each structural unit contained in the polymer was calculated from the area ratio of the peak corresponding to each structural unit in the spectrum obtained by the $^{13}$C-NMR.

Synthesis of Compound (A)

Synthesis Example 1: Synthesis of Compound (A-1)

To a flask equipped with a condenser and a stirrer was charged 100 g of methyl ethyl ketone, and nitrogen substitution was carried out. After heating to 85° C., a mixture of 100 g of methyl ethyl ketone, 51 g (0.49 mol) of styrene, 49 g (0.49 mol) of methyl methacrylate, 7.24 g (0.027 mol) of 12-mercaptododecanyl phosphonic acid and 3 g of 2,2'-azobis(2-methylpropionitrile) was added dropwise over 3 hrs at the same temperature. Polymerization was allowed for 3 hrs while the same temperature is maintained. The resulting polymerization reaction mixture was added dropwise into 3 L of methanol to carry out purification by precipitation. Thus, the residual monomer, initiator and the like were removed to give a compound (A-1). The compound (A-1) had Mw of 7,034, Mn of 5,122, and Mw/Mn of 1.37. The compound (A-1) was dissolved in propylene glycol monomethyl ether acetate (PGMEA) to prepare a solution containing 10% by mass of the compound (A-1).

Synthesis Example 2: Synthesis of Compound (A-2)

To a flask equipped with a condenser and a stirrer was charged 100 g of methyl ethyl ketone, and nitrogen substitution was carried out. After heating to 85° C., a mixture of 100 g of methyl ethyl ketone, 51 g (0.49 mol) of styrene, 49 g (0.49 mol) of methyl methacrylate, 1 g of copper (I) bromide, 1 g of N,N,N',N'',N''-pentamethyldiethylenetriamine, and 2 g of methyl bromoisobutyrate phosphonic acid was added dropwise over 3 hrs at the same temperature. Polymerization was allowed for 3 hrs while the same temperature is maintained. The resulting polymerization reaction mixture was added dropwise into 3 L of methanol to carry out purification by precipitation. Thus, the residual monomer, initiator and the like were removed to give a compound (A-2). The compound (A-2) had Mw of 6,715, Mn of 6,074, and Mw/Mn of 1.11. The compound (A-2) was dissolved in PGMEA to prepare a solution containing 10% by mass of the compound (A-2).

Synthesis Example 3: Synthesis of Compound (A-3)

To a flask equipped with a condenser and a stirrer was charged 100 g of methyl ethyl ketone, and nitrogen substitution was carried out. After heating to 85° C., a mixture of 100 g of methyl ethyl ketone, 51 g (0.49 mol) of styrene, 49 g (0.49 mol) of methyl methacrylate, 2.86 g (0.027 mol) of 3-mercaptopropionic acid and 3 g of 2,2'-azobis(2-methylpropionitrile) was added dropwise over 3 hrs at the same temperature. Polymerization was allowed for 3 hrs while the same temperature is maintained. The resulting polymerization reaction mixture was added dropwise into 3 L of methanol to carry out purification by precipitation. Thus, the residual monomer, initiator and the like were removed to give a compound (A-3). The compound (A-3) had Mw of 7,152, Mn of 5,134, and Mw/Mn of 1.39. The compound (A-3) was dissolved in PGMEA to prepare a solution containing 10% by mass of the compound (A-3).

Synthesis Example 4: Synthesis of Compound (A-4)

To a flask equipped with a condenser and a stirrer was charged 100 g of methyl ethyl ketone, and nitrogen substitution was carried out. After heating to 85° C., a mixture of 100 g of methyl ethyl ketone, 51 g (0.49 mol) of styrene, 49 g (0.49 mol) of methyl methacrylate, 4.32 g (0.027 mol) of 3-mercapto-1-propanesulfonic acid and 3 g of 2,2'-azobis(2-methylpropionitrile) was added dropwise over 3 hrs at the same temperature. Polymerization was allowed for 3 hrs while the same temperature is maintained. The resulting polymerization reaction mixture was added dropwise into 3 L of methanol to carry out purification by precipitation. Thus, the residual monomer, initiator and the like were removed to give a compound (A-4). The compound (A-4) had Mw of 7,002, Mn of 4,954, and Mw/Mn of 1.41. The compound (A-4) was dissolved in PGMEA to prepare a solution containing 10% by mass of the compound (A-4).

Synthesis Example 5: Synthesis of Compound (A-5)

To a flask equipped with a condenser and a stirrer was charged 100 g of methyl ethyl ketone, and nitrogen substitution was carried out. After heating to 85° C., a mixture of 100 g of methyl ethyl ketone, 51 g (0.49 mol) of styrene, 48 g (0.48 mol) of methyl methacrylate, 3.3 g (0.01 mol) of 12-phosphonic acid dodecanyl methacrylate, 5.5 g (0.027 mol) of mercapto-undecene and 3 g of 2,2'-azobis(2-methylpropionitrile) was added dropwise over 3 hrs at the same temperature. Polymerization was allowed for 3 hrs while the same temperature is maintained. The resulting polymerization reaction mixture was added dropwise into 3 L of methanol to carry out purification by precipitation. Thus, the residual monomer, initiator and the like were removed to give a compound (A-5). The compound (A-5) had Mw of 7,248, Mn of 5,121, and Mw/Mn of 1.42. The compound (A-5) was dissolved in PGMEA to prepare a solution containing 10% by mass of the compound (A-5).

Synthesis Example 6: Synthesis of Compound (A-6)

To a flask equipped with a condenser and a stirrer was charged 100 g of methyl ethyl ketone, and nitrogen substitution was carried out. After heating to 85° C., a mixture of 100 g of methyl ethyl ketone, 51 g (0.49 mol) of styrene, 48 g (0.48 mol) of methyl methacrylate, 2.0 g (0.01 mol) of 4-vinylphenylmethylene phophonic acid, 5.5 g (0.027 mol) of mercapto-undecene and 3 g of 2,2'-azobis(2-methylpropionitrile) was added dropwise over 3 hrs at the same temperature. Polymerization was allowed for 3 hrs while the same temperature is maintained. The resulting polymerization reaction mixture was added dropwise into 3 L of methanol to carry out purification by precipitation. Thus, the residual monomer, initiator and the like were removed to give a compound (A-6). The compound (A-6) had Mw of 6,749, Mn of 4,721, and Mw/Mn of 1.43. The compound (A-6) was dissolved in PGMEA to prepare a solution containing 10% by mass of the compound (A-6).

Synthesis Example 7: Synthesis of Compound (A-7)

To a flask equipped with a condenser and a stirrer was charged 100 g of methyl ethyl ketone, and nitrogen substitution was carried out. After heating to 85° C., a mixture of 100 g of methyl ethyl ketone, 51 g (0.49 mol) of styrene, 48 g (0.48 mol) of methyl methacrylate, 0.9 g (0.01 mol) of methacrylic acid, 5.5 g (0.027 mol) of mercapto-undecene and 3 g of 2,2'-azobis(2-methylpropionitrile) was added dropwise over 3 hrs at the same temperature. Polymerization was allowed for 3 hrs while the same temperature is maintained. The resulting polymerization reaction mixture was added dropwise into 3 L of methanol to carry out purification by precipitation. Thus, the residual monomer, initiator and the like were removed to give a compound (A-7). The compound (A-7) had Mw of 7,275, Mn of 5,211, and Mw/Mn of 1.40. The compound (A-7) was dissolved in PGMEA to prepare a solution containing 10% by mass of the compound (A-7).

Synthesis Example 8: Synthesis of Compound (A-8)

To a flask equipped with a condenser and a stirrer was charged 100 g of methyl ethyl ketone, and nitrogen substitution was carried out. After heating to 85° C., a mixture of 100 g of methyl ethyl ketone, 51 g (0.49 mol) of styrene, 48 g (0.48 mol) of methyl methacrylate, 1.5 g (0.01 mol) of vinyl benzoic acid, 5.5 g (0.027 mol) of mercapto-undecene and 3 g of 2,2'-azobis(2-methylpropionitrile) was added dropwise over 3 hrs at the same temperature. Polymerization was allowed for 3 hrs while the same temperature is maintained. The resulting polymerization reaction mixture was added dropwise into 3 L of methanol to carry out purification by precipitation. Thus, the residual monomer, initiator and the like were removed to give a compound (A-8). The compound (A-8) had Mw of 7,085, Mn of 4,962, and Mw/Mn of 1.43. The compound (A-8) was dissolved in PGMEA to prepare a solution containing 10% by mass of the compound (A-8).

Synthesis Example 9: Synthesis of Compound (A-9)

To a flask equipped with a condenser and a stirrer was charged 100 g of methyl ethyl ketone, and nitrogen substitution was carried out. After heating to 85° C., a mixture of 100 g of methyl ethyl ketone, 51 g (0.49 mol) of styrene, 48 g (0.48 mol) of methyl methacrylate, 1.1 g (0.01 mol) of vinyl sulfonate acid, 5.5 g (0.027 mol) of mercapto-undecene and 3 g of 2,2'-azobis(2-methylpropionitrile) was added dropwise over 3 hrs at the same temperature. Polymerization was allowed for 3 hrs while the same temperature is maintained. The resulting polymerization reaction mixture was added dropwise into 3 L of methanol to carry out purification by precipitation. Thus, the residual monomer, initiator and the like were removed to give a compound (A-9). The compound (A-9) had Mw of 7,193, Mn of 4,938, and Mw/Mn of 1.46. The compound (A-9) was dissolved in PGMEA to prepare a solution containing 10% by mass of the compound (A-9).

Synthesis Example 10: Synthesis of Compound (A-10)

To a flask equipped with a condenser and a stirrer was charged 100 g of methyl ethyl ketone, and nitrogen substitution was carried out. After heating to 85° C., a mixture of 100 g of methyl ethyl ketone, 51 g (0.49 mol) of styrene, 49 g (0.49 mol) of methyl methacrylate, 5.5 g (0.027 mol) of mercapto-undecane and 3 g of 2,2'-azobis(2-methylpropionitrile) was added dropwise over 3 hrs at the same temperature. Polymerization was allowed for 3 hrs while the same temperature is maintained. The resulting polymerization reaction mixture was added dropwise into 3 L of methanol to carry out purification by precipitation. Thus, the residual monomer, initiator and the like were removed to give a compound (A-10). The compound (A-10) had Mw of 7,038, Mn of 4,873, and Mw/Mn of 1.44. The compound (A-10) was dissolved in PGMEA to prepare a solution containing 10% by mass of the compound (A-10).

Synthesis of Block Copolymer

Synthesis Example 11: Synthesis of Block Copolymer (P-1)

After a 500 mL flask as a reaction vessel was dried under reduced pressure, 200 g of tetrahydrofuran, which had been subjected to a dehydrating treatment by distillation, was charged into the flask under a nitrogen atmosphere, and cooled to −78° C. Thereafter, 0.27 g of a 1 N sec-butyllithium (sec-BuLi) solution in cyclohexane was charged, and 10.7 g (0.103 mol) of styrene, which had been subjected to a dehydrating treatment by distillation, was added dropwise over 30 min. During this dropwise addition, the internal temperature of the reaction solution was carefully adjusted so as not to be −60° C. or higher. After the completion of the dropwise addition, the mixture was aged for 30 min. Then, 10.3 g (0.103 mol) of methyl methacrylate, which had been subjected to a dehydrating treatment by distillation, was further added dropwise over 30 min, and the reaction was allowed for 120 min. Thereafter, 1 mL of methanol as an end treatment agent was charged to permit the reaction. The temperature of the polymerization reaction mixture was elevated to the room temperature, and the resulting polymerization reaction mixture was concentrated. After replacing with propylene glycol methyl ether acetate (PGMEA), 1,000 g of a 2% by mass aqueous oxalic acid solution was added with stirring. Then, after the mixture was left to stand, the underlayer, i.e., an aqueous layer, was discarded. This operation was repeated three times to remove Li salts. Then, 1,000 g of ultra pure water was charged, the mixture was stirred, and then the underlayer, i.e., an aqueous layer, was discarded. This operation was repeated three times to remove oxalic acid. Thereafter, the resulting solution was concentrated, and then the mixture was added dropwise into 500 g of methanol to permit deposition of a polymer. The polymer obtained through vacuum filtration was washed twice with methanol, and then dried at 60° C. under reduced pressure to obtain 20.5 g of a white block copolymer (P-1).

The block copolymer (P-1) had Mw of 41,000, and Mw/Mn of 1.13. Furthermore, as a result of the $^{13}$C-NMR analysis, the proportion of the styrene unit in the block copolymer (P-1), and the proportion of the methyl methacrylate unit were 50.1 mol % and 49.9 mol %, respectively. Note that the block copolymer (P-1) was a diblock copolymer.

Preparation of Composition for a Base

Each of components used in preparing the composition for a base is shown below.

(A) Component

A-1 to A-10: solution containing 10% by mass of the compound (A-1) to (A-10) synthesized in Synthesis Examples 1 to 10 above A-11: 10% by mass solution prepared by dissolving dodecyl phosphonic acid (Tokyo Chemical Industry Co.,

Ltd.) in PGMEA, which is expected to form a monomolecular film as a base, on the substrate.

(B) Solvent
- B-1: propylene glycol monomethyl ether acetate
- B-2: methoxybutyl acetate
- B-3: butyl acetate
- B-4: cyclohexanone

(C) Acid Generating Agent

C-1: triphenylsulfonium 2-(norbornan-2-yl)-1,1,2,2-tetrafluoroethane-1-sulfonate (compound represented by the following formula (C-1))

C-2: di(4-t-butylphenyl)iodonium nonafluorobutanesulfonate (compound represented by the following formula (C-2))

(C-1)

(C-2)

Example 1: Preparation of Composition for Base (S-1)

A mixed solution was obtained by mixing: 100 parts by mass of a solution containing 10% by mass of (A-1) as the compound (A); 9,895 parts by mass of (B-1) as the solvent (B); and 5 parts by mass of (C-1) as the acid generating agent (C) to permit dissolution. A composition for a base (S-1) was prepared by filtration of the resulting mixed solution through a membrane filter having a pore size of 0.1 μm. The composition for a base (S-1) had a solid content concentration of 0.15% by mass.

Examples 2 to 16, and Comparative Examples 1 and 2

Compositions for a base (S-2) to (S-16), and (CS-1) and (CS-2) were prepared in a similar manner to Example 1 except that each component of the type and the amount shown in Table 1 below was used. The solid content concentration (% by mass) of each composition for a base thus obtained is shown together in Table 1.

TABLE 1

|  |  | Example | | | | | | | | |
|---|---|---|---|---|---|---|---|---|---|---|
|  |  | 1 | 2 | 3 | 4 | 5 | 6 | 7 | 8 | 9 |
| Composition for a base |  | S-1 | S-2 | S-3 | S-4 | S-5 | S-6 | S-7 | S-8 | S-9 |
| Solution containing compound (A) (parts by mass) | A-1 | 100 | | | | | | | | |
|  | A-2 | | 100 | | | | | | | |
|  | A-3 | | | 100 | | | | | | |
|  | A-4 | | | | 100 | | | | | |
|  | A-5 | | | | | 100 | | | | |
|  | A-6 | | | | | | 100 | | | |
|  | A-7 | | | | | | | 100 | | |
|  | A-8 | | | | | | | | 100 | |
|  | A-9 | | | | | | | | | 100 |
|  | A-10 | | | | | | | | | |
|  | A-11 | | | | | | | | | |
| (B) Solvent (parts by mass) | B-1 | 9,895 | | 9,895 | 9,895 | 9,895 | | 9,895 | 9,895 | |
|  | B-2 | | 9,895 | | | | | | | |
|  | B-3 | | | | | | 9,895 | | | |
|  | B-4 | | | | | | | | | 9,895 |
| (C) Acid generating agent (parts by mass) | C-1 | 5 | 5 | 5 | 5 | 5 | 5 | 5 | 5 | 5 |
|  | C-2 | | | | | | | | | |
| Solid content concentration of composition for a base (% by mass) |  | 0.15 | 0.15 | 0.15 | 0.15 | 0.15 | 0.15 | 0.15 | 0.15 | 0.15 |

|  |  | Example | | | | | | | Comparative Example | |
|---|---|---|---|---|---|---|---|---|---|---|
|  |  | 10 | 11 | 12 | 13 | 14 | 15 | 16 | 1 | 2 |
| Composition for a base |  | S-10 | S-11 | S-12 | S-13 | S-14 | S-15 | S-16 | CS-1 | CS-2 |
| Solution containing compound (A) (parts by mass) | A-1 | | | | | | | | | |
|  | A-2 | 100 | | | 150 | | | | | |
|  | A-3 | | | | | | | | | |
|  | A-4 | | | | | | | | | |
|  | A-5 | | | | | | | | | |
|  | A-6 | | 100 | | | 150 | | | | |

TABLE 1-continued

|  |  | Col1 | Col2 | Col3 | Col4 | Col5 | Col6 | Col7 | Col8 | Col9 |
|---|---|---|---|---|---|---|---|---|---|---|
|  | A-7 |  |  |  |  |  |  |  |  |  |
|  | A-8 |  |  |  |  |  |  |  |  |  |
|  | A-9 |  |  | 100 |  | 150 |  |  |  |  |
|  | A-10 |  |  |  |  |  |  | 100 | 150 |  |
|  | A-11 |  |  |  |  |  | 150 |  |  |  |
| (B) Solvent | B-1 |  |  |  | 9,850 | 9,850 | 9,850 | 9,850 | 9,895 | 9,850 |
| (parts by | B-2 | 9,895 |  |  |  |  |  |  |  |  |
| mass) | B-3 |  | 9,895 |  |  |  |  |  |  |  |
|  | B-4 |  |  | 9,895 |  |  |  |  |  |  |
| (C) Acid | C-1 |  |  |  |  |  |  |  | 5 |  |
| generating agent (parts by mass) | C-2 | 5 | 5 | 5 |  |  |  |  |  |  |
| Solid content concentration of composition for a base (% by mass) |  | 0.15 | 0.15 | 0.15 | 0.15 | 0.15 | 0.15 | 0.15 | 0.15 | 0.15 |

Preparation of Composition for Pattern Formation

The resultant block copolymer (P-1) was dissolved in PGMEA to give a 1% by mass solution. A composition for pattern formation (J-1) was prepared by filtration of this solution through a membrane filter having a pore size of 200 nm.

Base Treatment

Using each composition for a base prepared as described above, a coating film having a film thickness of 20 nm was provided on the surface of a 12-inch silicon wafer, exposed with an ArF excimer laser beam (wavelength: 193 nm), and baked at 200° C. for 120 sec. Then, in order to remove the compound (A) having failed to interact with the substrate, washing with a 2.38% by mass aqueous tetramethylammonium hydroxide solution was carried out, followed by further washing with ultra pure water. The base treatment of the substrate was completed by drying the substrate at 100° C. for 120 sec.

Pattern Formation

On the silicon wafer substrate having the base formed on the surface thereof, the composition for pattern formation (J-1) was applied to provide a coating film such that the directed self-assembling film formed had a film thickness of 30 nm, followed by heating at 250° C. for 10 min to permit phase separation, thereby forming a microdomain structure. Next, dry etching was carried out by a plasma treatment to form a relief pattern having a pitch of 30 nm.

Evaluations

The receding contact angle of the surface of the substrate subjected to the base treatment was measured. In addition, on the pattern formed as described above, the favorableness of the fingerprint, and rectangularity of pattern configuration as a marker of favorableness of formation of the phase separation structure through directed self-assembly were evaluated, respectively, according to the following method.

Receding Contact Angle (RCA)

The receding contact angle of the surface of the substrate subjected to the base treatment was rapidly measured by using a contact angle meter (KRUSS GmbH, "DSA-10") in an environment involving a room temperature of 23° C., a humidity of 45% and a normal pressure in accordance with the following procedure.

1) Adjusting the position of a wafer stage.
2) Placing the wafer on the stage.
3) Drawing water into a needle.
4) Finely tuning the position of the needle.
5) Discharging water from the needle to form a 25 μL bead of water on the wafer.
6) Retracting the needle once from the bead of water.
7) Pulling the needle again back to the position as tuned in 4) above.
8) Aspirating the water bead for 150 sec with the needle at a rate of 10 μL/min, during which a contact angle was concurrently measured once per second, 150 times in total.
9) Calculating an averaged value of contact angle measurements at 20 time points in total acquired after the time point when the measurement of the contact angle was stabilized, thereby deriving the receding contact angle.

The measurements of the receding contact angle obtained after the exposure and before the washing, and after the washing are shown together in Table 2.

Favorableness of Fingerprint and Rectangularity of Pattern Configuration

The formed pattern was observed using a scanning electron microscope (Hitachi, Ltd., "S-4800") to evaluate favorableness of the fingerprint, and rectangularity of pattern configuration.

With respect to the favorableness of the fingerprint, the evaluation was made as: "A (favorable)" when clear phase separation was ascertained and a defect was not found; and "B (unfavorable)" when the phase separation was incomplete, or a defect was found.

With respect to the rectangularity of pattern configuration, the evaluation was made as: "A (favorable)" when the pattern configuration was recognized to have rectangularity; and "B (unfavorable)" when the pattern configuration was not recognized to have rectangularity. The results of the evaluations are together shown in Table 2.

TABLE 2

|  |  | Receding contact angle | |  |  |
|---|---|---|---|---|---|
|  | Composition for a base | after exposure and before washing | after washing | Favorableness of fingerprint | Rectangularity of pattern configuration |
| Example 1 | S-1 | 72.9 | 60.3 | A | A |
| Example 2 | S-2 | 73.1 | 60.5 | A | A |
| Example 3 | S-3 | 71.3 | 60.0 | A | A |
| Example 4 | S-4 | 72.4 | 60.1 | A | A |
| Example 5 | S-5 | 72.1 | 60.2 | A | A |
| Example 6 | S-6 | 73.0 | 60.4 | A | A |
| Example 7 | S-7 | 73.1 | 60.3 | A | A |
| Example 8 | S-8 | 72.2 | 60.1 | A | A |
| Example 9 | S-9 | 72.1 | 60.0 | A | A |
| Example 10 | S-10 | 71.4 | 60.2 | A | A |
| Example 11 | S-11 | 72.3 | 60.4 | A | A |
| Example 12 | S-12 | 71.2 | 60.1 | A | A |
| Example 13 | S-13 | 73.1 | 58.4 | A | A |

TABLE 2-continued

| | Composition for a base | Receding contact angle after exposure and before washing | after washing | Favorableness of fingerprint | Rectangularity of pattern configuration |
|---|---|---|---|---|---|
| Example 14 | S-14 | 73.0 | 57.7 | A | A |
| Example 15 | S-15 | 72.0 | 58.2 | A | A |
| Example 16 | S-16 | 68.9 | 52.5 | A | A |
| Comparative Example 1 | CS-1 | 71.9 | 47.6 | B | B |
| Comparative Example 2 | CS-2 | 70.9 | 45.6 | B | B |

As is clear from the results shown in Table 2, the compositions for a base of Examples enabled the receding contact angle of the surface of the substrate subjected to the base treatment after the exposure and before washing to be appropriately increased. As a result, the fingerprint can be favorable, a phase separation structure through directed self-assembly can be favorably formed, and formation of a pattern with rectangularity is enabled. On the other hand, the compositions for a base of Comparative Examples resulted in a low receding contact angle of the surface of the substrate subjected to the base treatment after washing. Possibly due to the low receding contact angle, it is revealed that the fingerprint was unfavorable, and favorable formation of a phase separation structure through directed self-assembly failed and also formation of a pattern with rectangularity failed.

According to the composition for a base and directed self-assembly lithography method of the embodiment of the present invention, a phase separation structure through directed self-assembly can be favorably formed, and formation of a pattern with rectangularity is enabled. Therefore, these can be suitably used for lithography processes in manufacture of various types of electronic devices such as semiconductor devices and liquid crystal devices for which further miniaturization is demanded.

Obviously, numerous modifications and variations of the present invention are possible in light of the above teachings. It is therefore to be understood that within the scope of the appended claims, the invention may be practiced otherwise than as specifically described herein.

The invention claimed is:

1. A composition for a base of a directed self-assembling, the composition comprising:
a compound comprising an oxo acid group; and
a solvent,
wherein the oxo acid group is a phosphoric acid group, a phosphono group, a sulfo group, a sulfuric acid group, a carboxy group, or a combination thereof,
wherein the compound is represented by formula (1):

$$A{+}B)_n \quad (1)$$

wherein, in the formula (1), A represents an organic group having 10 or more carbon atoms and having a valency of n; and B represents the oxo acid group,
wherein n is 1, and the organic group is a polymer and the oxo acid group binds to an end of a main chain of the polymer,
wherein the compound represented by formula (1) is obtained by polymerizing a vinyl monomer in a presence of a chain transfer agent and a radical polymerization initiator which is different from the chain transfer agent in a reaction solvent, wherein the chain transfer agent comprises a compound having the oxo acid group at an end of the compound, and
wherein the solvent is at least one selected from the group consisting of a polyhydric alcohol partially etherified solvent having 3 to 19 carbon atoms, a monocarboxylic acid ester, and a cyclic ketone solvent.

2. The composition according to claim 1, further comprising an acid generating agent.

3. The composition according to claim 1, wherein an upper limit of a polystyrene equivalent weight average molecular weight (Mw) of the compound as determined by gel permeation chromatography is 30,000.

4. The composition according to claim 1, wherein an upper limit of a polystyrene equivalent weight average molecular weight (Mw) of the compound as determined by gel permeation chromatography is 15,000.

5. The composition according to claim 1, wherein a content of the compound in a total solid content of the composition is no less than 70% by mass.

6. The composition according to claim 1, wherein a content of the compound in a total solid content of the composition is no less than 85% by mass.

7. The composition according to claim 1, wherein the chain transfer agent comprises a compound having the oxo acid group and a mercapto group at an end of the compound.

8. The composition according to claim 1, wherein the polymer is a random copolymer.

9. The composition according to claim 1, wherein the polymer is a block copolymer.

10. The composition according to claim 1, wherein the solvent is at least one selected from the group consisting of a polyhydric alcohol partially etherified solvent having 3 to 19 carbon atoms and a monocarboxylic acid ester.

* * * * *